United States Patent

Tanaka et al.

[11] Patent Number: 6,049,401
[45] Date of Patent: Apr. 11, 2000

[54] VOLUME HOLOGRAPHIC MEMORY

[75] Inventors: Satoru Tanaka; Hideki Hatano; Takashi Yamaji, all of Tsurugashima, Japan

[73] Assignee: Pioneer Electronic Corporation, Tokyo, Japan

[21] Appl. No.: 09/166,467

[22] Filed: Oct. 5, 1998

[30] Foreign Application Priority Data

Oct. 7, 1997 [JP] Japan .................................. 9-274221

[51] Int. Cl.⁷ .................................................. G03H 1/02
[52] U.S. Cl. .................................... 359/3; 359/8; 359/22; 359/35; 359/614
[58] Field of Search ................................. 359/1, 3, 7, 8, 359/22, 24, 25, 35, 614

[56] References Cited

U.S. PATENT DOCUMENTS

| | | | |
|---|---|---|---|
| 4,017,144 | 4/1977 | Staebler | 359/3 |
| 5,339,305 | 8/1994 | Curtis et al. | 359/3 |
| 5,550,779 | 8/1996 | Burr et al. | 359/3 |
| 5,844,700 | 12/1998 | Jegnathan et al. | 359/7 |
| 5,887,090 | 3/1999 | Rudolph et al. | 359/7 |

*Primary Examiner*—Darren E. Schuberg
*Attorney, Agent, or Firm*—Perman & Green, LLP

[57] ABSTRACT

A volume holographic memory whose three-dimensional photosensitive body has exposed portions comprised only of continuous faces prevents recording of noise caused by scattered light at the time of light irradiation.

4 Claims, 8 Drawing Sheets

FIG.1

RECORDING LIGHT
REFERENCE LIGHT
$\theta_1$
$\theta_2$

FIG.2

RECORDING LIGHT
REFERENCE LIGHT

VOLUME HOLOGRAPHIC MEMORY

BACKGROUND OF THE INVENTION

1. Field of the Invention

The present invention relates to a volume holographic memory.

2. Description of the Related Art

Writing and reading data into and from a volume holographic memory are generally carried out in the following procedures. Digital data is converted to ON/OFF signals of spatial light, such as a dot pattern image with a contrast on a flat panel surface, a diffracted light of this image data or a signal light is caused to interfere with a coherent reference light and the resultant interference pattern is written and recorded in a holographic memory, e.g., a rectangular parallelopiped recording medium. The image of a dot pattern that is reproduced by irradiating the same light as the reference light on this holographic memory is received by an array of photodetectors, the output signal of the photodetector array is processed and converted back to digital data by an electronic circuit, then this digital data is read out.

A Fourier transform hologram is frequently used in data recording in a holographic memory.

In general, an image is considered as various spatial frequency components multiplexed in various directions. The distribution of the multiplexed spatial frequency components of an image can be acquired mathematically by computing two-dimensional Fourier transform in a similar manner to the way a time-variable electric signal or acoustic signal can be broken into various sinusoidal components.

Optically acquiring the angular distribution of the amplitude of a diffracted light of a uniform parallel light incident to an image using the Fraunhofer's diffraction phenomenon is equivalent to mathematical acquisition of two-dimensional Fourier transform of the amplitude transmittance of that image. A Fourier transform hologram is what is obtained by forming the image of a diffracted light from an image which is irradiated with a coherent parallel light, i.e., a signal light, by means of a Fourier transform lens located apart by its focal distance, transforming the image to a distribution on the focal plane or Fourier plane, causing the distribution resulting from the Fourier transform with a coherent reference light, and then recording the resulting pattern as interference fringes on a photosensitive material which is applied on a flat plate.

Because a wave surface recorded in a Fourier transform hologram corresponds to a Fourier-transformed image, the wave surface should undergo inverse Fourier transform for wavefront reconstruction as an image. Inverse Fourier transform is equivalent to convergence by a Fourier transform lens of a diffracted light reconstructed by irradiating the same reference light on a Fourier transform hologram on a flat plate, and the distribution of the amplitude transmittance of the original image is reconstructed on the Fourier plane.

A planar Fourier transform hologram has such an advantage that recording redundancy can be increased because a hologram can be stored in a limited space and information is dispersed in space after being subjected to Fourier transform.

In addition to such a planar Fourier transform hologram, there is a volume hologram thicker than the planar one. Generally, the volume hologram is deemed advantageous over the planar type in recording a vast amount of information due to its capability of making the diffraction efficiency greater. In this volume holographic memory, two-dimensional image data is recorded page by page in a dispersed manner in the three-dimensional space of this recording medium.

Since image data is recorded only at the portion in the holographic memory where the signal light and the reference light intersect each other, it is possible to implement spatial multiplexed recording by properly shaping the lateral cross-sectional shape of the reference light according to the shape of the recording medium. With the use of the reference light being shaped into an elliptical light beam of 1 mm in the vertical direction and 4 mm in the horizontal direction, for example, multiplexed recording in the units of 1 mm in the vertical direction is possible. In this case, recording is done by matching the position of the signal light with that of the reference light.

Recording media capable of recording a three-dimensional interference pattern inside as its spatial change in refractive index are recently receiving attention as a volume holographic memory. Such recording media include a photorefractive crystal such as lithium niobate (LN).

The photorefractive effect is a phenomenon such that charges generated by optical excitation move inside a crystal, forming the spatial electric field which is combined with the linear electrooptic effect or the Pockels effect, thus changing the refractive index of the crystal. In ferroelectric crystals having the photorefractive effect, the refractive index varies in response even to a tiny light input pattern normally of over 1000 lines per 1 mm and the effect occurs in real time at a response speed of the microsecond to second order depending on the material. Because of this property, studies on various applications of ferroelectric crystals as development-free real-time hologram media are under way.

Coherent lights which are used as the recording light and reference light are mainly a laser beam. As the laser beam has a Gaussian distribution of intensity in the widthwise direction, the light at the foot portion of the Gaussian distribution is irradiated outside the desired position even on the assumption that light of a predetermined intensity is to be irradiated on a predetermined position inside a photosensitive body. Further, at the time of angular multiplexing, as the reference light runs on the low angle side with respect to the normal axis of the irradiation plane, it has a greater irradiation width with respect to the photosensitive body. The greater irradiation width on a photosensitive body, whose size is limited in order to increase the recording density for more efficient recording, causes scattering of light incident to the edge portion of the photosensitive body, particularly, discontinuous faces at a portion where flat surfaces intersect one another as in a polygonal body or polyhedron. This light scattering may be recorded in a hologram as noise which adversely affects the quality of a reconstructed image.

Figure 3:
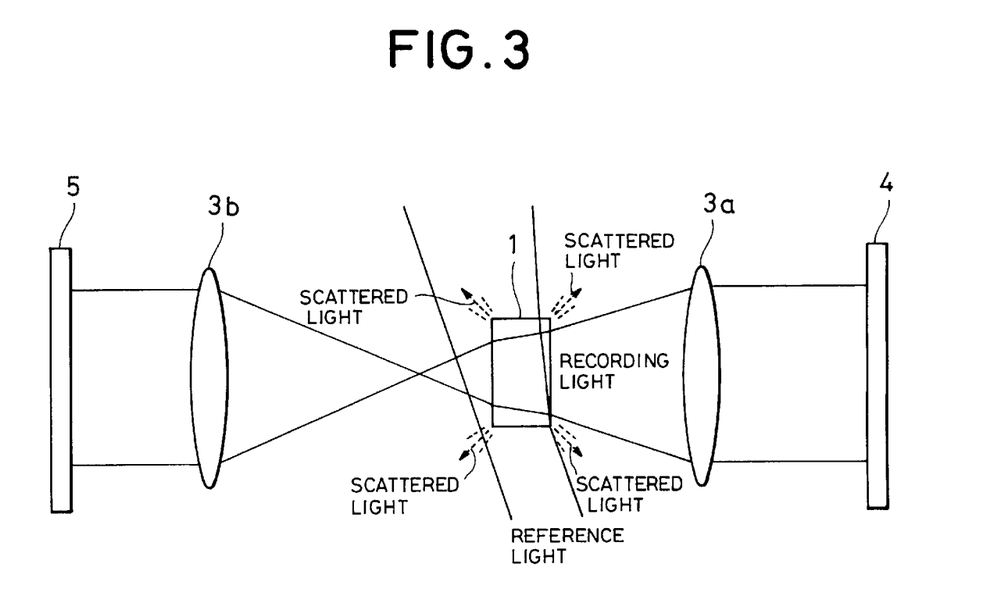
FIG. 3 is a structural diagram depicting prior art.

FIG. 3 is an exemplary diagram showing irradiation of the recording light and the reference light when a photosensitive body 1 has a rectangular parallelopiped shape. When the reference light and recording light are irradiated, light scattering occurs at an angled portion of the rectangular parallelopiped photosensitive body 1 or a face-intersecting portion. The scattered light is superimposed on the recording light or reference light and is recorded as noise.

OBJECT AND SUMMARY OF THE INVENTION

Accordingly, it is an object of the present invention to provide a volume holographic memory which prevents additional recording of scattered light, as noise, which is produced when the peripheral portions of a recording light and a reference light are irradiated on an edge portion of a photosensitive body at the time of recording a volume hologram.

A volume holographic memory according to this invention is characterized by including a three-dimensional photosensitive body sensitive to a spatial distribution of light energy produced by interference of a coherent recording light and coherent reference light, for recording the spatial distribution of light energy, and that exposed portions of the photosensitive body are comprised only of continuous faces.

In an embodiment of the volume holographic memory of the invention, said photosensitive body has a polygonal shape or a curved shape and a face-intersecting portion of said photosensitive body has a light absorbing property.

In an embodiment of the volume holographic memory of the invention, said photosensitive body has a light absorbing member for covering all faces except those where each of said recording light and said reference light comes incident and passes through.

In an embodiment of the volume holographic memory of the invention, said light absorbing member has a cross section with a knife edge shape whose thickness increases from a boundary with said photosensitive body.

In an embodiment of the volume holographic memory of the invention, said photosensitive body has a disk shape whose edge surfaces are comprised only of continuous curved faces.

In an embodiment of the volume holographic memory of the invention, said photosensitive body has a light absorbing member for covering said edge surfaces.

A volume holographic memory according to the invention comprises a three-dimensional photosensitive body sensitive to a spatial distribution of light energy produced by interference of a coherent recording light and coherent reference light, for recording the spatial distribution of light energy, wherein the photosensitive body is defined by only a continuous curved face.

Since the volume holographic memory according to the invention whose three-dimensional photosensitive body does not has any non-continuous face at the exposed portions thereof, there is no scattering in recording light and reference light at the time of irradiation, thus preferably prevents the generation of scattered light from bringing about recording of noise.

DETAILED DESCRIPTION OF THE PREFERRED EMBODIMENTS

Figure 1:
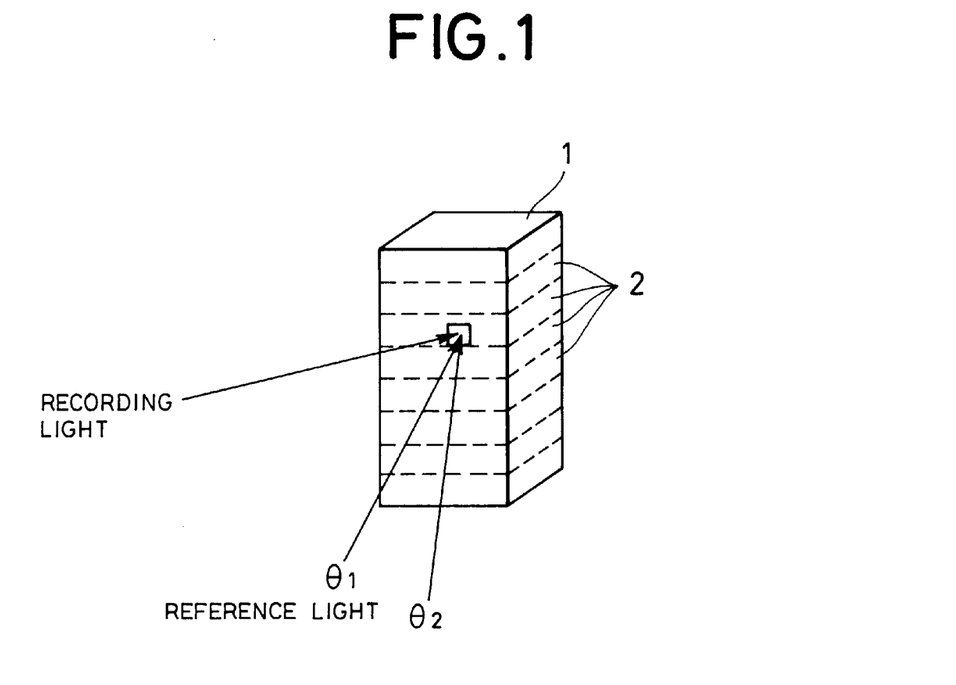
FIG. 1 is an exemplary diagram showing one example of a recording system.
Figure 2:
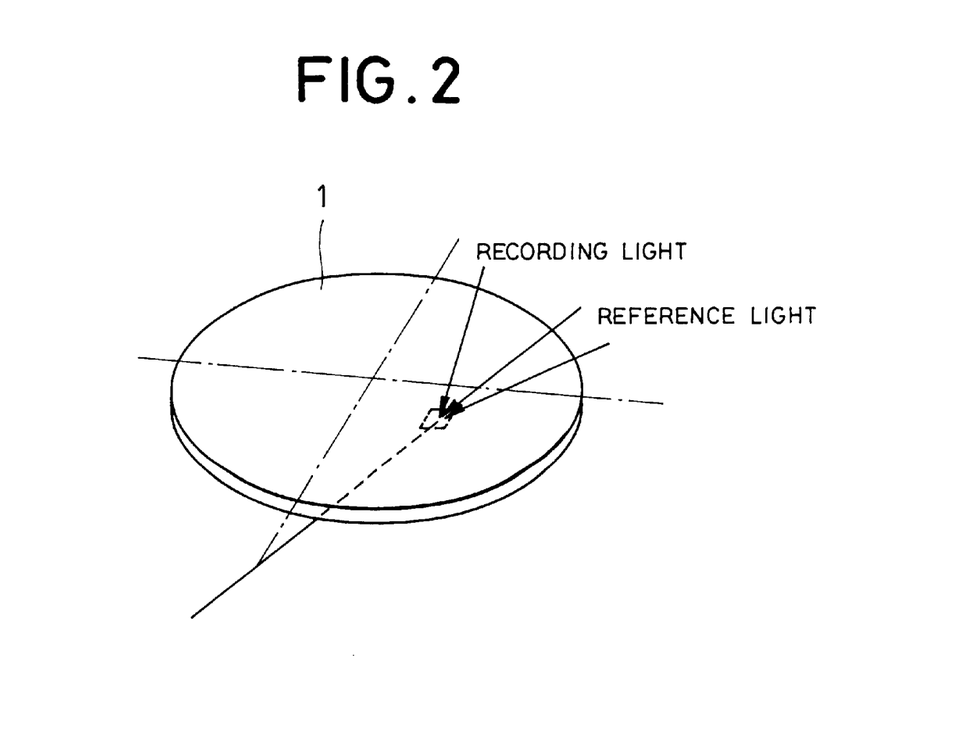
FIG. 2 is an exemplary diagram exemplifying another recording system.

In a case where a volume holographic memory is actually used as a storage device, the system memory capacity is secured by implementing angular multiplexing in which recording is carried out by changing the irradiation angle of the reference light in the same space of the recording medium or spatial multiplexing in which recording is carried out by sequentially changing the recording space. In the angular multiplexing system, recording or reproduction of one page of information is executed with the reference light at a preset irradiation angle and recording or reproduction of plural pages of information is implemented by repeatedly irradiating the reference light at substantially the same position of the recording medium while changing the irradiation angle of the reference light. The intervals should be set large enough not to cause cross-talk of page images recorded at adjacent angles, at the time of reading. Various spatial multiplexing schemes are being studied, such as a scheme of using a transparent photosensitive body 1 as a rectangular parallelopiped recording medium and providing stacks 2 as blocks of different information at spatially different locations as shown in FIG. 1, and a scheme of using a photosensitive body 1 as a disk-shaped recording medium and implementing recording while sequentially shifting the recording place every time the disk rotates as shown in FIG. 2.

A photorefractive crystal which records a three-dimensional light interference pattern as a spatial change in refractive index in the crystal is used as the photosensitive body in use. Specifically, lithium niobate (LN) is frequently used. Though having some demerits for holographic multiplexed recording such as a long writing time, lithium niobate has advantages in its relatively long retaining life after recording and ensured fixation and being easy to handle.

Figure 4:
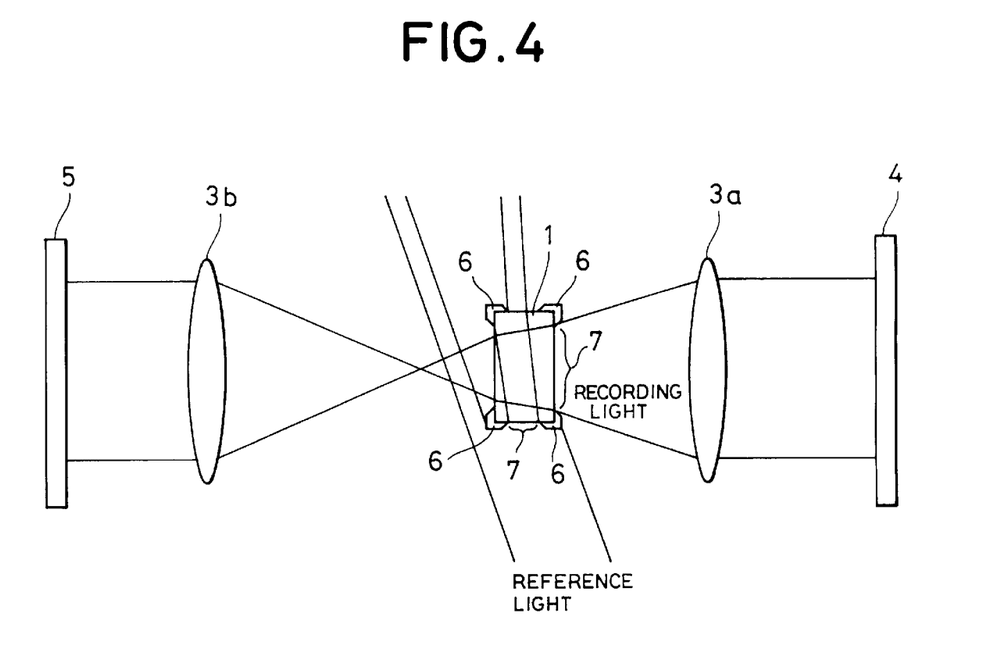
FIG. 4 is a structural diagram illustrating one embodiment of this invention.

A volume holographic memory according to one embodiment shown in FIG. 4 includes a photosensitive body 1 of a rectangular parallelopiped shape as one example of a polygonal shape or polyhedron. Angled portions of the photosensitive body 1 or face-intersecting portions thereof are covered with a light absorbing member 6 to prevent irregular reflection of light that occurs as the peripheral portion of the incident light enters such a face-intersecting portion. The light absorbing member 6 forms an incident window 7 from which a planer surface of the photosensitive body 1 appears. The light absorbing member 6 has a cross section with a knife edge shape whose thickness gradually increases from the boundary with the photosensitive body 1 to the direction of the face intersection. This member prevents the light incident to the incident window 7 from impinging onto the edge portions of the light absorbing member 6 and being diffracted, thus suppressing light disturbance. To prevent the incident light from causing multiplexed reflection between the light absorbing member 6 and the photosensitive body 1, it is preferable that the light absorbing member 6 is not placed apart from the photosensitive body 1, but put in close contact with the photosensitive body 1. The light absorbing member 6 should be made of a material which neither reflects nor scatters light, desirably of a material which absorbs all the lights in the wavelength band of the incident light. For example, the possible preferable materials include an aluminum plate plated with a dark color such as black and a sheet-like material such as paper of a dark color such as black. The face-intersecting portions may be transformed by a chemical treatment or the like so that the light absorbing portion is integrated with the photosensitive body. Further, a light-absorbing paint material may be coated to the photosensitive body to form the light absorbing layer 6, or a light-absorbing material may be adhered to the photosensitive body by sputtering to thereby form the light absorbing layer 6. The material of the light absorbing layer 6 has a refractive index grater than that of the photosensitive body 1. Before coating or adhering the light absorbing layer 6, the surfaces of the face-intersecting portions may be frosted, rounded off and/or continuously beveled by a chemical or mechanical treatment. In other words, each of the incident surfaces of the photosensitive body to which the recording light and reference light are to be incident, or exposed portions, is comprised only of a smoothly continuous flat face as a flat surface without any unevenness.

Figure 5:
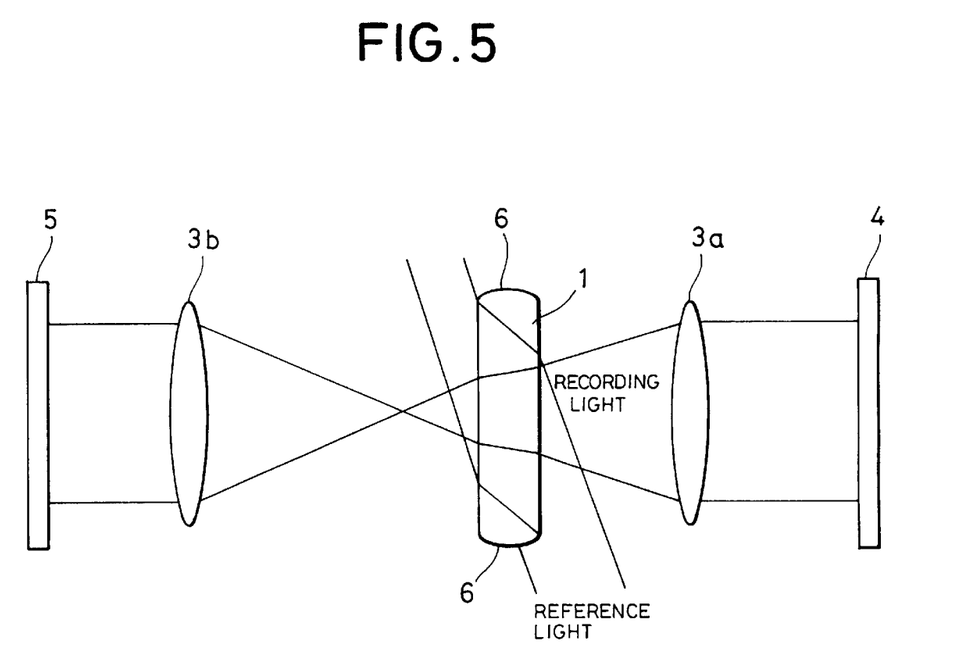
FIG. 5 is a structural diagram showing another embodiment of this invention.

FIG. 5 shows an embodiment in which the photosensitive body 1 has a disk shape. When the incident light such as the reference light or recording light is irradiated on an edge surface of the disk, scattered light is produced. To suppress the occurrence of scattered light, therefore, the shapes of the edge surfaces of the disk are made of gentle continuous curved faces. It is more preferable that the edge portions of the disk are subjected to a process of providing the light absorbing property, such as a process of making the edge portions dark such as black.

Figure 6:
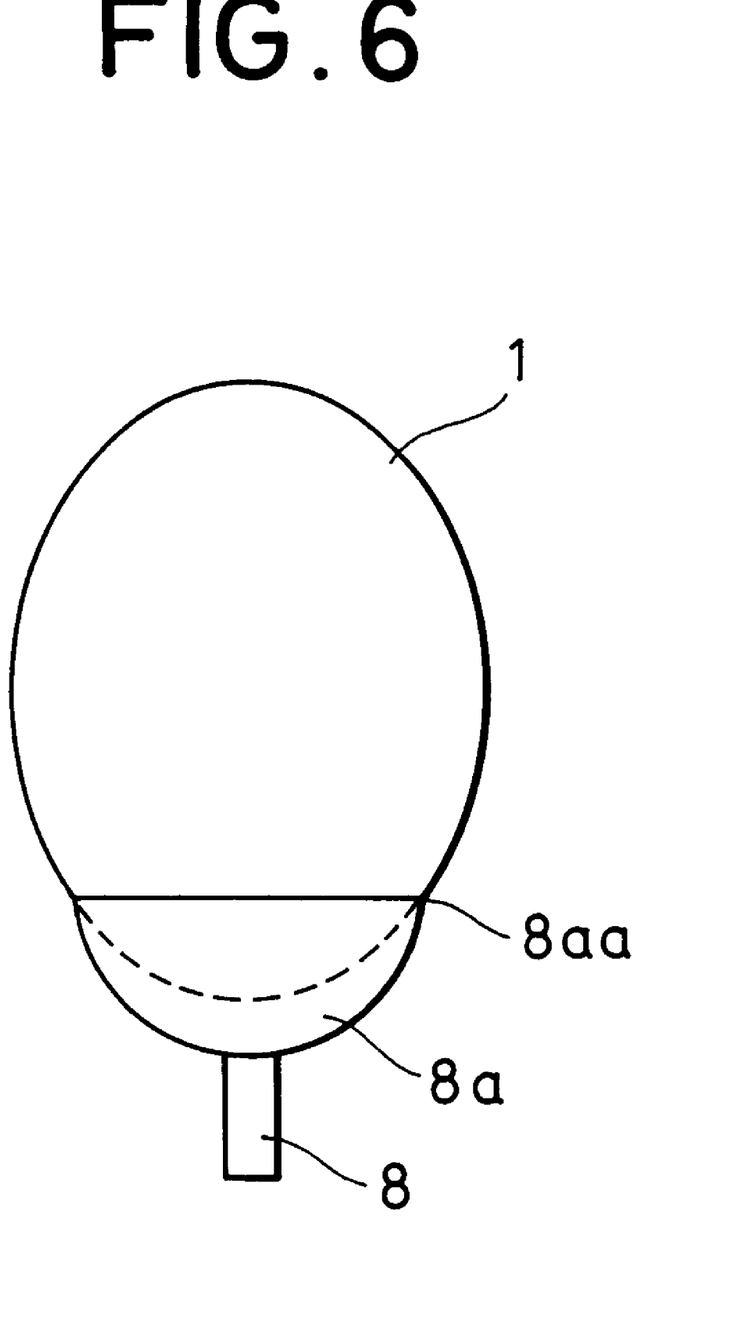
FIG. 6 is a structural diagram depicting a further embodiment of this invention.

FIG. 6 shows an embodiment in which the photosensitive body 1 is an ellipsoid solid. The photosensitive body 1 is supported at its one end portion by a bowl-shaped portion 8a of a support 8 coated with a dark material, and the bowl-shaped portion 8a has at least a light absorbing capability. An annular end portion 8aa of the bowl-shaped portion 8a is formed in a knife-edge cross-sectional shape whose thickness gradually increases toward the end portion of the photosensitive body 1. Alternatively, the photosensitive body 1 may be a spherical body as well as a curved body such as a cylindrical or conical body rounded off at the edges as long as the photosensitive body is comprised of only a smoothly continuous curved face without any unevenness.

Figures 7A, 7B:
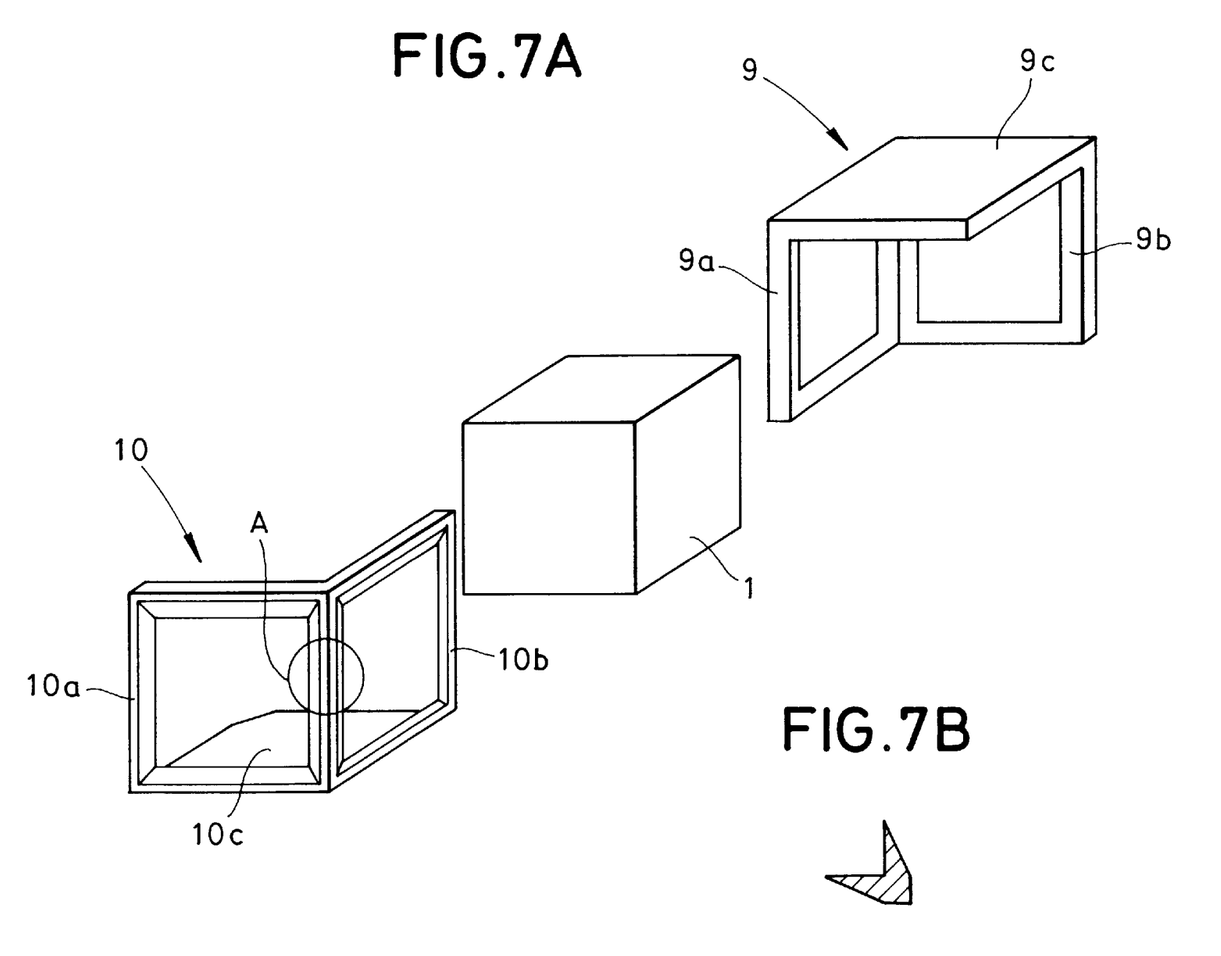
FIG. 7A is an exploded perspective view of a different embodiment of this invention.
FIG. 7B is an enlarged cross-sectional view of a part A in FIG. 7A.
Figure 8A:
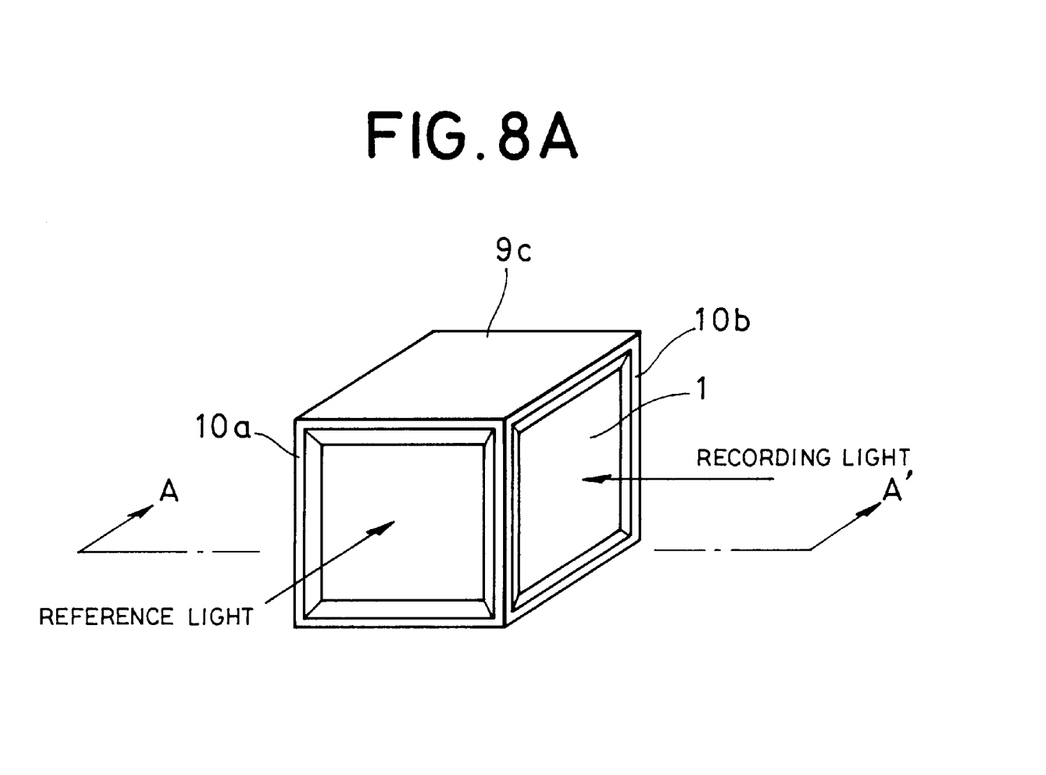
FIG. 8A is a perspective view showing the embodiment in FIG. 6 after being assembled.
Figure 8B:
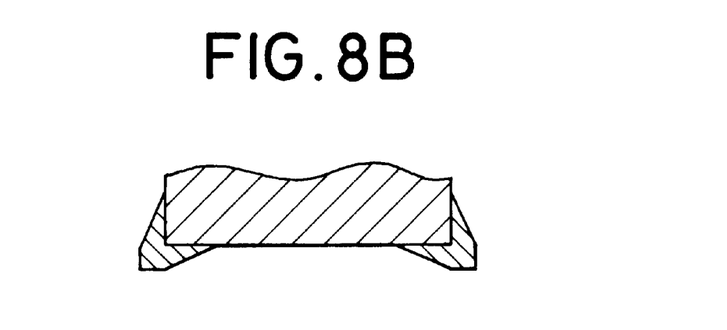
FIG. 8B is a cross-sectional view of the line A-A' in FIG. 8A.

FIG. 7A is a perspective view showing a rectangular parallelopiped photosensitive body 1 of LN and aluminum blocks 9 and 10 undergone black plating, and FIG. 8A is a perspective view showing the blocks 9 and 10 assembled together. The blocks 9 and 10, when assembled, form a casing which can accommodate the photosensitive body 1. The blocks 9 and 10 each have window frames 9a, 9b, 10a and 10b in their center portions to and through which the reference light is incident and passes, and also respectively have an upper surface portion 9c and a lower surface portion 10c for supporting the upper and lower surfaces of the photosensitive body 1. The window frames are formed by the blocks 9 and 10 made of a light absorbing material, so as not to expose the face-intersecting portions of the photosensitive body 1. For the recording light and reference light, a total of four windows facing one another are provided in this manner. In a case where the blocks 9 and 10 require a certain thickness for they serve as a support for the photosensitive body 1, the window frames should have a knife-edge thickness as shown in the cross-sectional view in FIG. 7B along a plane parallel to the bottom surface portion 10c of the a portion A of the window frame and a cross-sectional view in FIG. 8B along the line A-A', in order to prevent diffraction and scattering of light at the internal edge portions of the window.

Figure 9:
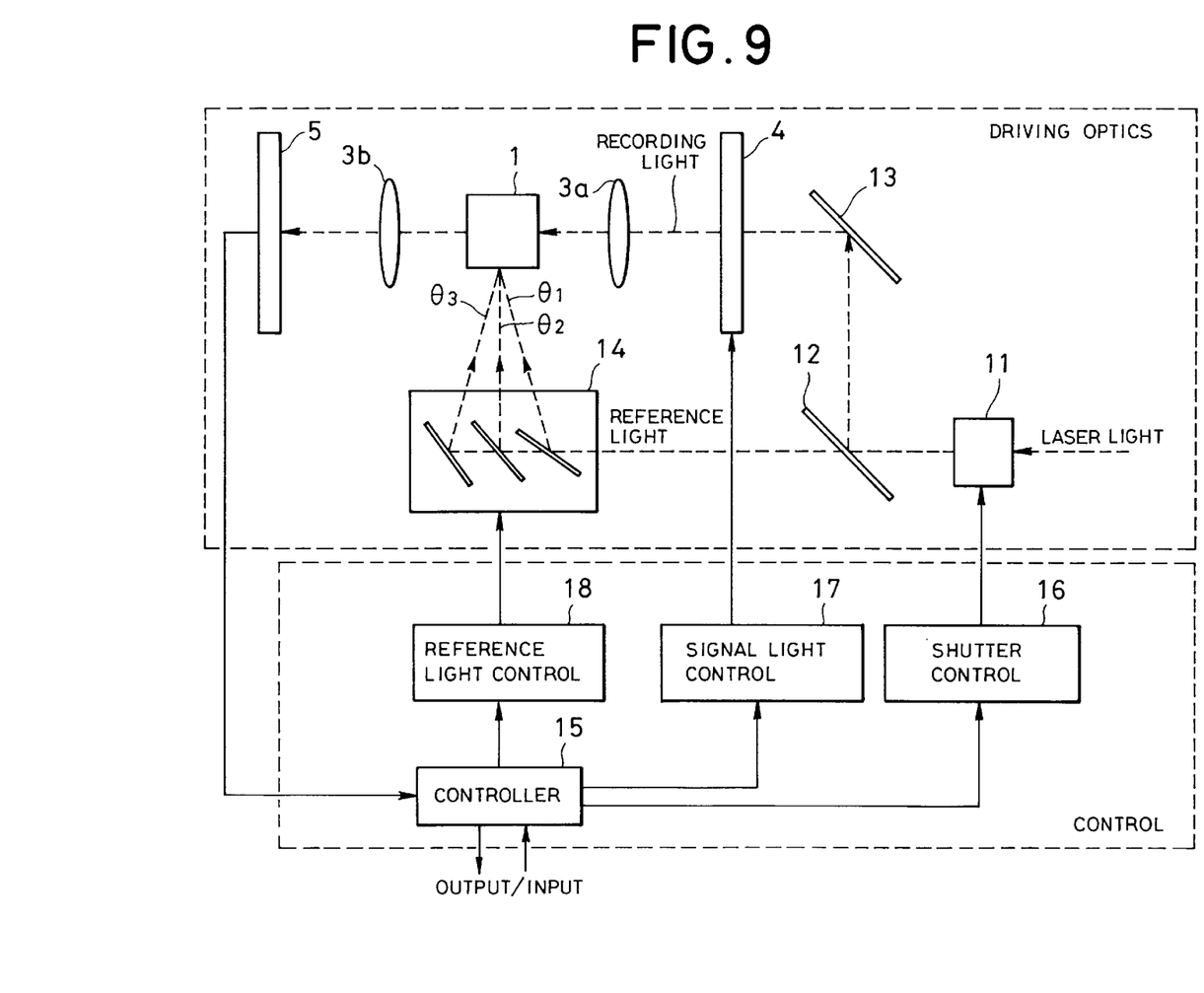
FIG. 9 is a block diagram illustrating a recording/reproducing apparatus which uses a volume holographic memory.

FIG. 9 exemplifies an optical information recording/reproducing apparatus which uses the volume holographic memory of this invention. In this apparatus, digital signals to be recorded are input to a controller 15 which in turn performs processes such as affixing an error correction code and binary coding. The processed signals are then converted to signals of page image rows by a signal light control driver 17, and data for each page is sent as a page image to a spatial light modulator 4 of a light transmission type such as an TFT-LCD (thin film transistor-liquid crystal display). After the signal light beam is subjected to spatial modulation as a two-dimensional lattice pattern representing transmission/non-transmission for each pixel, the resultant light is subjected to Fourier transform by a Fourier transform lens 3a. The Fourier-transformed light is condensed and impinged on a recording medium i.e., cube photosensitive body 1, forming a Fourier transform image inside the photosensitive body 1. At the same time, the controller 15 moves a pager reflector 14 in association with the image data via a reference light control driver 18, changing the angular position of the reflector. As a result, the reference light whose incident angle has been set to a predetermined angle ($\theta 1$) is irradiated for a predetermined time, writing a hologram. Thereafter, a sequence of procedures, such as transmission of a page image, setting of the incident angle ($\theta 2$ or $\theta 3$) of the reference light and recording a hologram, is repeated. In association with the setting of one angle, one page of information is stored. Such a storage system is called the angular multiplexing system.

The following are the reproduction procedures. The controller 15 closes the shutter 6a, sets the incident angle of the reference light reflected by the pager reflector 14 to a predetermined value corresponding to the set value for image recording by means of the reference light control driver 18, irradiates only the reference light, and guides the diffracted light of the interference pattern on a two-dimensional photodetector array 5 including the CCD using an inverse Fourier transform lens 3b, thereby forming a reconstructed page image on the two-dimensional photodetector array 5. The intensity of the reference light should be set sufficiently lower than the one set at the time of recording so as not to erase recorded information, and the irradiation time of the reference light should also be set by a shutter control driver 16 and the reference light control driver 18 in such a way as the photodetector output has the proper S/N ratio. The controller 15 performs signal processing such as decoding and error correction on the photodetector output, and recorded data is read out as a consequence.

What is claimed is:

1. A volume holographic memory comprising:
   a three-dimensional photosensitive body sensitive to a spatial distribution of light energy produced by interference of a coherent recording light and coherent reference light for recording said spatial distribution of light energy,
   exposed portions of said photosensitive body being comprised only of continuous faces,
   Wherein said photosensitive body has a polygonal shape or a curved shape and a face-intersecting portion of said photosensitive body has a light absorbing property.

2. The volume holographic memory according to claim 1, wherein said photosensitive body has a light absorbing member for covering all faces except those where each of said recording light and said reference light comes incident and passes through.

3. The volume holographic memory according to claim 2, wherein said light absorbing member has a cross section with a knife edge shape whose thickness increases from a boundary with said photosensitive body.

4. A volume holographic memory comprising:
   a three-dimensional photosensitive body sensitive to a spatial distribution of light energy produced by interference of a coherent recording light and coherent reference light for recording said spatial distribution of light energy,
   exposed portions of said photosensitive body being comprised only of continuous faces,
   wherein said photosensitive body has a disk shape whose edge surfaces are comprised only of continuous curved faces,
   wherein said photosensitive body has a light absorbing member for covering said edge surface.

* * * * *